(12) United States Patent
Lin

(10) Patent No.: US 6,348,384 B1
(45) Date of Patent: Feb. 19, 2002

(54) METHOD OF USING ORGANIC POLYMER AS COVERING LAYER FOR DEVICE LIGHTLY DOPED DRAIN STRUCTURE

(75) Inventor: Shun Li Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/899,141

(22) Filed: Jul. 6, 2001

(51) Int. Cl.[7] .............................................. H01L 21/336

(52) U.S. Cl. ..................... 438/279; 438/301; 438/303; 438/306

(58) Field of Search ......................... 438/275, 279–280, 438/289–292, 299–307

(56) References Cited

U.S. PATENT DOCUMENTS 6,103,137 A * 8/2000 Park ............................ 438/294

* cited by examiner

*Primary Examiner*—Jey Tsai
(74) *Attorney, Agent, or Firm*—Rosenberg, Klein & Lee

(57) ABSTRACT

The present invention provides a method of using organic polymer as a covering layer for a device lightly doped drain (LDD) structure, wherein a photo resist is covered by organic polymer, and ion implantation of different energies and kinds are performed to the same region of different line widths, thereby achieving the effect of LDD. Additionally, the covering layer of organic polymer is removed by means of simple and easy oxygen plasma etch so as not to increase the complexity of fabrication process. The complex fabrication process of a device LDD structure in the prior art is thus greatly improved.

17 Claims, 6 Drawing Sheets

METHOD OF USING ORGANIC POLYMER AS COVERING LAYER FOR DEVICE LIGHTLY DOPED DRAIN STRUCTURE

FIELD OF THE INVENTION

The present invention relates to a device lightly doped drain (LDD) structure and, more particularly, to a device LDD structure using organic polymer as a covering layer to cover over a photo resist.

BACKGROUND OF THE INVENTION

The fabrication process of today integrated circuits (ICs) is very complicated. In order to meet the requirement of low cost and high integration, device sizes need to shrink continually. For instance, the channel length of a transistor shrinks from 0.35 micrometer in 1996 to 0.18 micrometer in 1999, and this trend will maintain up to 2010 with a channel length smaller than 0.10 micrometer. When the device gets smaller, its channel length shrinks accordingly, and the operating speed of the transistor will get faster. However, the channel length of a MOS transistor cannot shrink unlimitedly. When the channel length shrinks to a certain extent, problems originated from shortening of channel length will arise. This phenomenon is called short channel effect. Moreover, when the channel length shrinks (smaller than 1 micrometer), the threshold voltage of the device is no longer constant, and will decrease along with shortening of the channel length.

In addition to resulting in a reduction of the threshold voltage, short channel effect will also bring about the phenomenon of hot electron effect, thereby affecting the operation of a MOS transistor. Generally speaking, a prior art method of resolving hot electron effect resulted from short channel effect is lightly doped drain, briefly termed LDD. As shown in FIG. 1, in this MOS structure, a gate 12 is formed on a silicon wafer 10. An n-type region used as an LDD 18, which has a lower doping than an n-type source 14 and an n-type drain 16, is added at the source 14 and the drain 16 near the channel in the silicon wafer 10.

Evidently, the channel electric field distribution of a MOS having the LDD 18 will shift toward the drain 16, and the magnitude of the electric field will be lower than that of a MOS without the LDD. Therefore, influence of hot electron effect will lessen. Moreover, hot electron effect has another influence on a MOS. In addition that most of the electrons generated due to impact of hot electrons are absorbed by the drain 16, part electrons will pass through a silicon oxide 20 and move toward the gate 12. Most of these electrons will be trapped in the silicon oxide 20, hence changing the charge quantity $Q_{OX}$ of the silicon oxide 20. Because $Q_{OX}$ increases continually with the operation of the MOS, the threshold voltage will thus be changed. The design of the LDD 18 can also decrease the occurrence of this problem. Therefore, the design of LDD has been widely applied to short channel NMOS and CMOS semiconductor devices. The fabricating method of LDD commonly used in semiconductor devices in the prior art is illustrated below with a MOS device structure as an example. A MOS structure is composed of three different electrodes: a gate, a source, and a drain. The gate of a MOS is first fabricated in the active region of the surface of a silicon wafer. Next, the fabrication of the source and drain of a MOS depends on the gate used as a mask to complete the fabrication of the main body of an NMOS transistor. As shown in FIG. 2(a), a gate 22 of a MOS is used as a mask. Next, phosphorous (P) is used as an ion source to perform ion implantation of P ions to a silicon wafer 24, hence forming an N-implanted region 26. The implanted region has a lower concentration of about the order of $10^{13}/cm^3$, and is used mainly as an LDD for preventing the occurrence of short channel effect. Next, as shown in FIG. 2(b), a silicon oxide 28 used as a gate spacer is deposited on the surface of the silicon wafer 24 by means of chemical vapor deposition (CVD). Before etching the spacer 30 to the silicon wafer 24, the silicon wafer 24 with the LDD N-implanted region can be sent into a thermal diffusion furnace beforehand. Diffusion of P atoms is performed at a high temperature of about 900 to 1000° C. Silicon atomic structure on part surface of the silicon wafer 24 damaged due to ion implantation is thus simultaneously annealed. Subsequently, etching of the spacer 30 is performed to the silicon wafer 24 covered by the silicon oxide 28 by means of anisotropic etch. Anisotropy, which is characteristic of dry etch, is utilized to remove most of the silicon oxide 28 deposited on the silicon wafer 28. Because the silicon oxide 28 situated above the side wall of the gate 22 is thicker than other parts thereof, it will not be completely removed, hence forming the spacer 30 shown in FIG. 2(c). In addition that this spacer can be used to separate the gate 22 and the other two electrodes of MOS, most important, heavy doping of the source and the drain can be performed using the structure formed of this spacer and the gate 22. This step is called $N^+$-implantation, wherein the gate 22 having the spacer 30 is used as a mask, and phosphorous or arsenic is used as an ion source, thereby performing $N^+$-implantation of high concentration and deeper depth to the silicon wafer 24. The $N^+$-implanted regions used as a source 32 and a drain 34 have a concentration of about $10^{15}/cm^3$, as shown in FIG. 2(d). The part of the N-implanted region where $N^+$-implantation is not performed is an LDD 36. A transistor structure with an LDD is thus completed.

As can be known from the above description, the fabrication of LDD plays a very important role in the electrical characteristics of semiconductor devices. However, the above method does not apply to mask ROMs, resulting in unstable threshold voltages and relative increase of leakage currents thereof. Accordingly, the present invention proposes a new LDD fabricating method, which can extensively apply to LDDs of semiconductor devices such as mask ROMs to prevent semiconductor devices from generating short channel effect.

SUMMARY OF THE INVENTION

The primary object of the present invention is to provide a method of using organic polymer as a covering layer for a device LDD structure, wherein ions of different energies and kinds are implanted into the same region of different line widths to achieve the effect of LDD.

Another object of the present invention is to apply a covering layer of organic polymer on a photo resist to change the magnitudes of line width, hence varying the size and region of ion implantation.

Yet another object of the present invention is to provide an LDD method of simple fabrication process so that the organic polymer as a covering layer is simple to use and can be easily removed.

Additionally, the present invention can directly perform ion implantation of LDD to the berry diffusion (BD) layer of a mask ROM. This is also an object of the present invention.

To achieve the above objects, in the present invention, a patterned photo resist is first formed on a silicon substrate. Shallow ion implantation is then performed to the silicon substrate to form a shallowly doped layer. Next, a covering layer of organic polymer covers on the photo resist. Deep ion implantation of high dose is then performed to the silicon substrate to form a deeply doped layer as a drain and a source. Finally, after the covering layer and the photo resist are removed, a poly gate is formed on the silicon substrate.

The various objects and advantages of the present invention will be more readily understood from the following detailed description when read in conjunction with the appended drawings, in which:

DETAILED DESCRIPTION OF THE PREFERRED EMBODIMENTS

FIG. 3 shows diagrams of performing ion implantation of LDD with the BD layer of a mask ROM device as an example. As shown in the figure, a photo resist (PR) layer is first spun on a semiconductor Si substrate 40. After the PR layer undergoes the steps of expose and develop, the channel position of the semiconductor device is defined to obtain a patterned PR 42 shown in FIG. 3(a). Next, shallow ion implantation of boron ions ($B^+$) or phosphorous ions ($P^+$) is performed to the Si substrate 40 with the patterned PR 42 as a mask, as shown in FIG. 3(b). This implanted dose is lower, and this implanted energy is smaller, letting the implanted depth of the Si substrate 40 be shallower. Ions can be successfully implanted into the Si substrate 40 not covered by the PR 42. Other ions will be blocked by the PR 42. A shallowly doped layer 44 is thus formed in the Si substrate 40, as shown in FIG. 3(c). This shallowly doped layer 44 is an N-implanted region of lower concentration in the semiconductor device LDD structure. The device channel shown in the figure is already doped with ions to form the shallowly doped layer 44 of the device channel.

Figure 1:
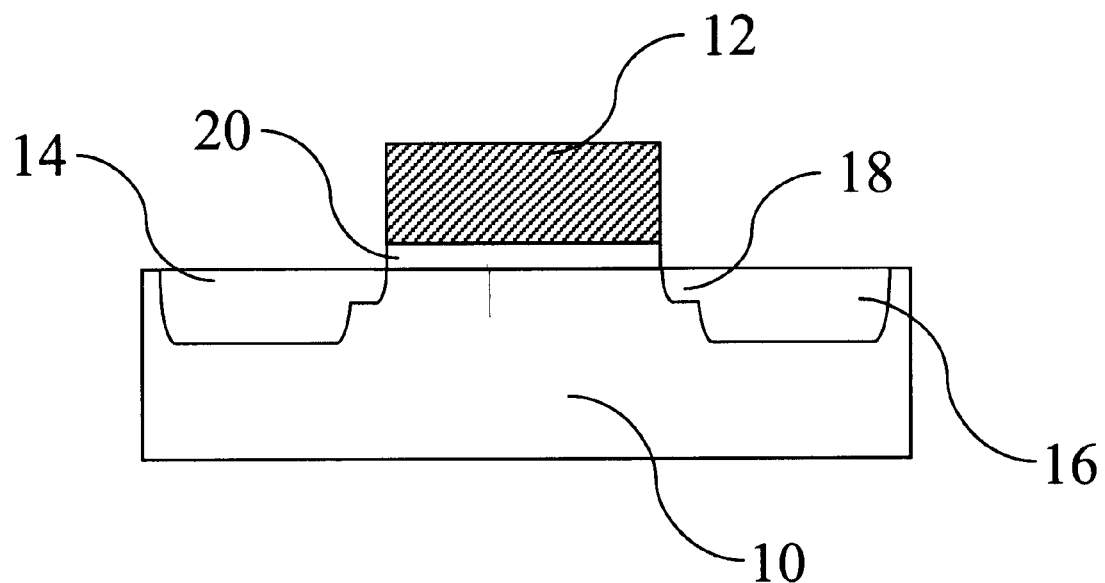
FIG. 1 is a structure diagram of a MOS structure designed using LDD.
Figure 2A:
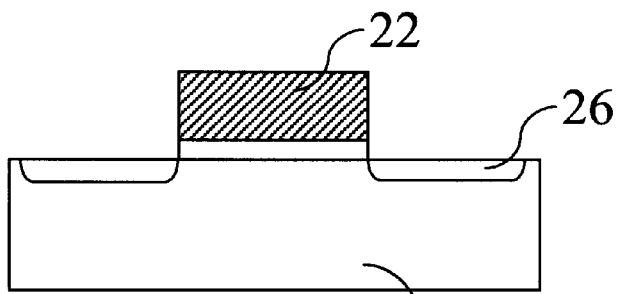
FIGS. 2(a) to 2(d) show a fabricating method of a semiconductor device LDD structure in the prior art.
Figure 2B:
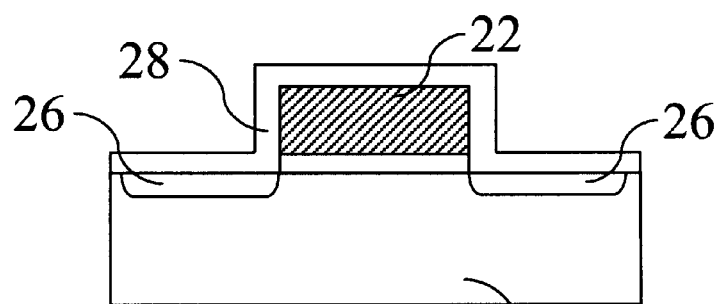
Figure 2C:
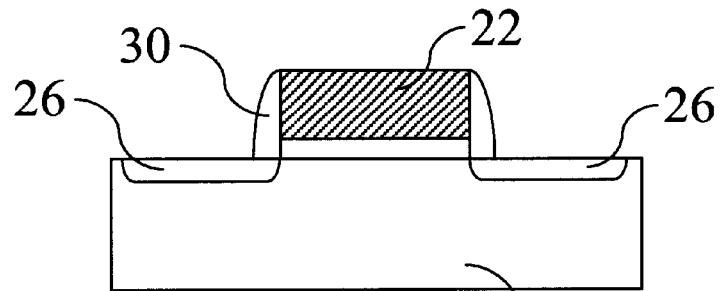
Figure 2D:
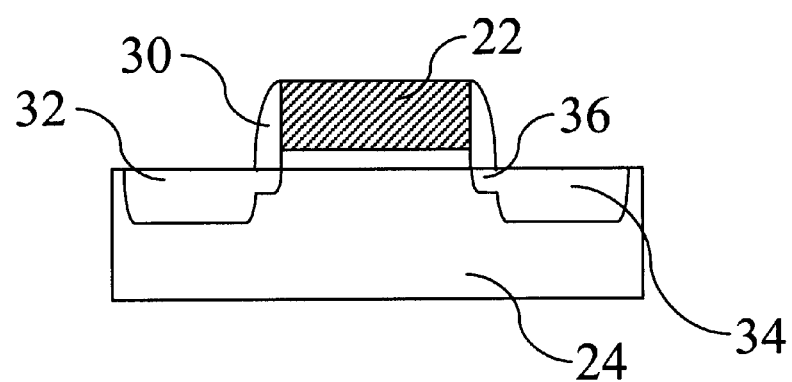
Figure 3A:
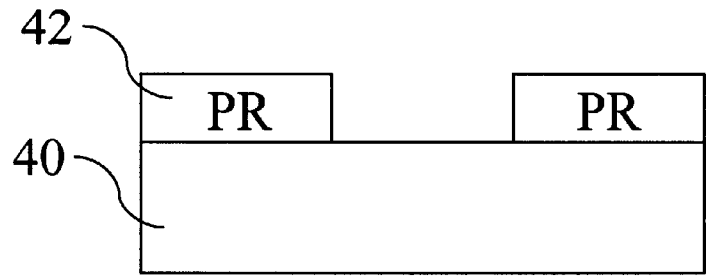
FIGS. 3(a) to 3(f) show diagrams of performing LDD in a semiconductor device according to an embodiment of the present invention.
Figure 3B:
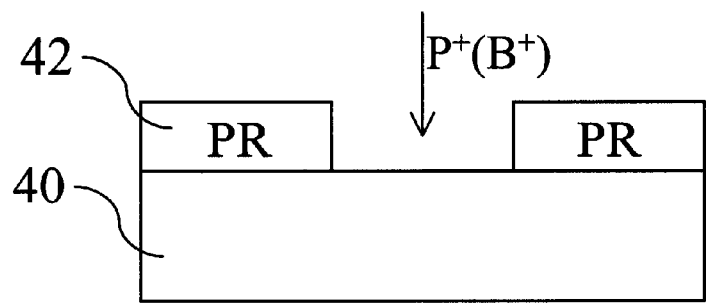
Figure 3C:
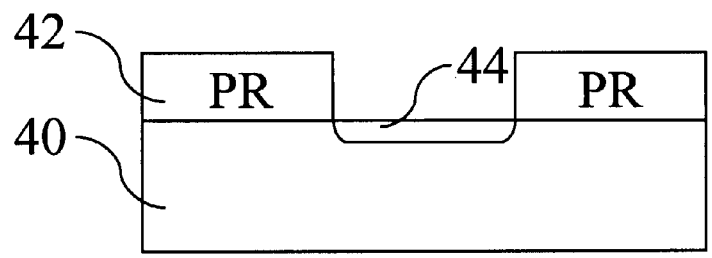
Figure 3D:
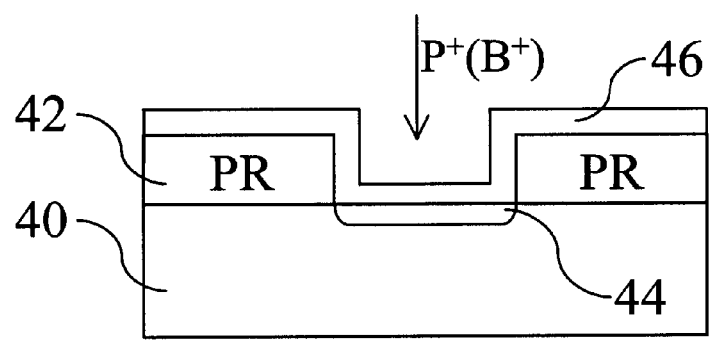
Figure 3E:
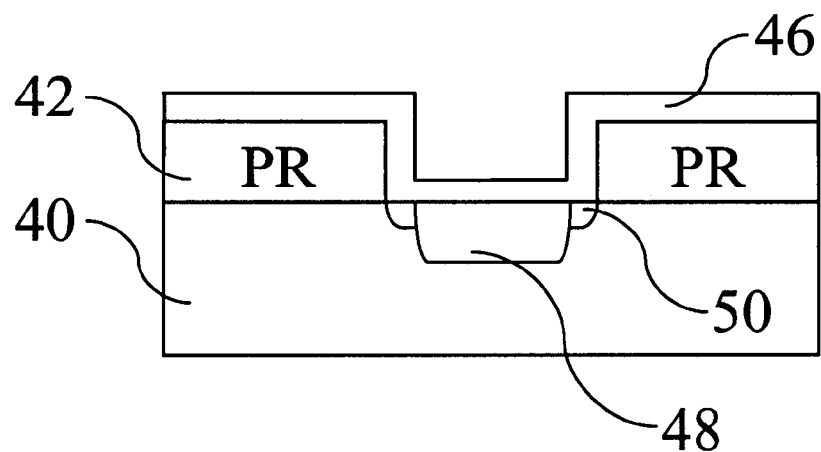
Figure 3F:
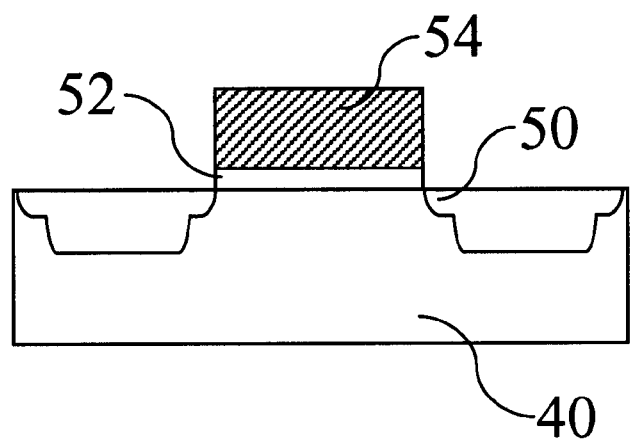
Figure 4A:
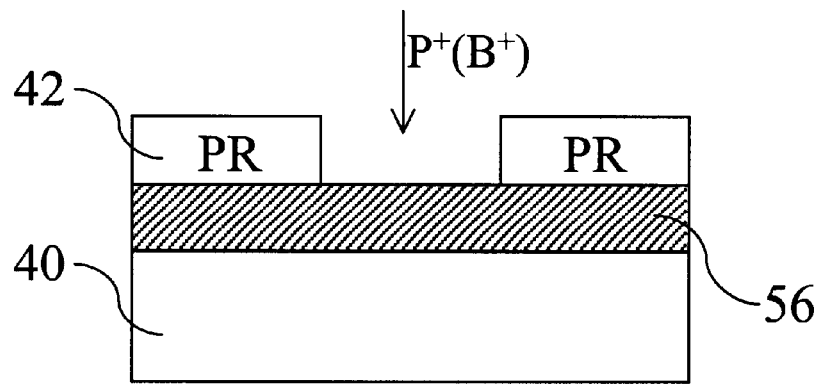
FIGS. 4(a) to 4(e) show diagrams of performing LDD in a semiconductor device accordingly to another embodiment of the present invention.
Figure 4B:
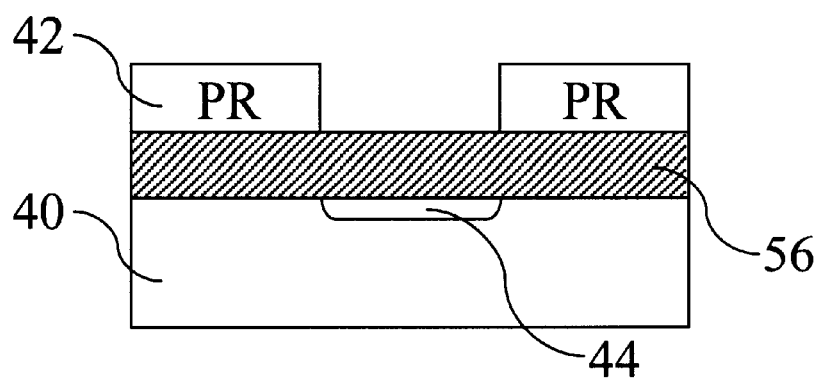
Figure 4C:
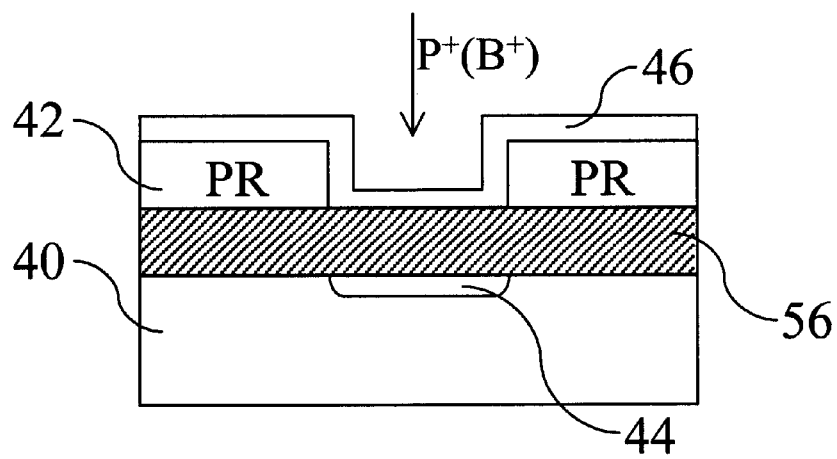
Figure 4D:
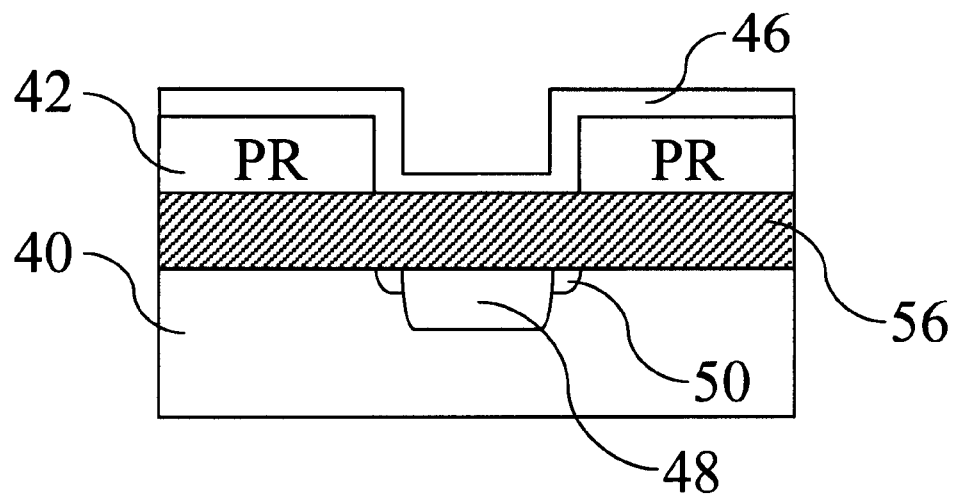
Figure 4E:
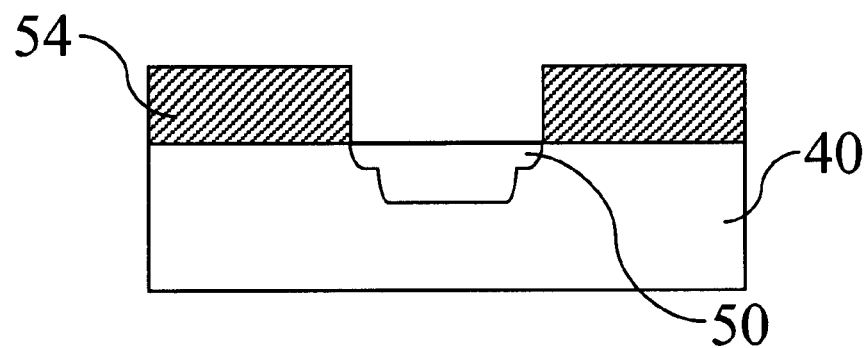

After completing the above lightly doped layer, a covering layer 46 of organic polymer is spun on the surface of the patterned PR 42. Next, deep ion implantation of high dose $B^+$, $P^+$, or other effective ions is performed to the Si substrate 40, as shown in FIG. 3(d). This implanted dose is relatively higher, and this implanted energy is relatively larger, letting the implanted depth of the Si substrate 40 be deeper. Although there is a covering layer 46 of organic polymer on the surface of the Si substrate 40 not covered by the PR 42, ions can easily penetrate through this covering layer 46 and be successfully implanted into the Si substrate 40 due to a larger implantation energy. Other ions will be blocked by the PR 42. A deeply doped layer 48 is thus formed in the Si substrate 40, as shown in FIG. 3(e). This deeply doped layer 48 is an $N^+$-implanted region of higher concentration in the semiconductor device LDD structure. Using the covering layer 46 of organic polymer to change the length of the device channel, the object of reducing the implanted region of channel of a semiconductor device is achieved, obtaining an LDD 50 structure shown in the figure. The covering layer 46 of organic polymer and the PR 42 are then removed by means of oxygen plasma etch. It is also feasible to remove them first using organic solvent and then using the method of acid/alkali. Finally, an oxide 52 is first deposited on the Si substrate 40 be means of CVD, and a poly gate 54 is then stacked thereon to define the structure position of the semiconductor device, as shown in FIG. 3(f).

It is also feasible that the covering layer 46 of organic polymer does not attach on the deeply doped layer 48, or the organic polymer there is removed using other solvent.

In addition to the above method, the present invention can also define the LDD structure of a semiconductor device in another way. As shown in FIGS. 4(a) to 4(e), a poly layer 56 is first deposited on the Si substrate 40, and a patterned PR 42 is then formed on the surface of the poly layer 56. Shallow ion implantation is performed to the Si substrate 40 with the PR 42 as a mask so that $B^+$or $P^+$ions penetrate through the poly layer 56 to form a shallowly doped layer 44 in the Si substrate 40. Next, a covering layer 46 of organic polymer covers on the PR 42 to determine the size of line width. It is also feasible that the covering layer 46 of organic polymer situated above the deeply implanted region does not attach thereon, or the organic polymer there is removed using other solvent. Deep ion implantation of high dose is performed to the Si substrate 40 so that $B^+$or $P^+$ions penetrate through the poly layer 56 to form a deeply doped layer 48 used as a drain and a source. Simultaneously, an LDD 50 structure is obtained. Finally, after etch process is performed to the poly layer 56 with the PR 42 as a mask, the covering layer 46 and the PR 42 are then removed. The remained poly layer 56 on the Si substrate 40 thus forms the poly gate 54.

Etch bias generated at the side region of the poly gate 54 above the LDD 50 is controlled by the etch process.

To sum up, the present invention utilizes a covering layer of organic polymer on a photo resist to change the magnitudes of line width so that the size and region of ion implantation can be varied. Ion implantation of different energies and kinds are performed to the same region of different line widths to achieve the effect of LDD. Moreover, the covering layer of organic polymer is simple to use and can be easily removed, hence not increasing the complexity of fabrication process. Contrarily, the complex fabrication process of LDD in the prior art is greatly improved.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A method of using organic polymer as a covering layer for a device lightly doped drain structure, comprising the steps of:

forming a patterned photo resist on a semiconductor substrate;

performing shallow ion implantation to said semiconductor substrate to form a shallowly doped layer;

covering a covering layer of organic polymer on said photo resist to determine the size of line width;

performing deep ion implantation of high dose to said semiconductor substrate to form a deeply doped layer as a drain and a source; and forming a poly gate on said semiconductor substrate after removing said covering layer and said photo resist.

2. The method as claimed in claim 1, wherein said semiconductor substrate is a silicon wafer.

3. The method as claimed in claim 1, wherein boron ions, phosphorous ions, or other ions are implanted during said shallow ion implantation.

4. The method as claimed in claim 1, wherein boron ions, phosphorous ions, or other ions are implanted during said deep ion implantation.

5. The method as claimed in claim 1, wherein said covering layer of organic polymer and said photo resist are removed by means of oxygen plasma.

6. The method as claimed in claim 1, wherein said covering layer of organic polymer and said photo resist are removed first using organic solvent and then using method of acid/alkali.

7. The method as claimed in claim 1, wherein said shallowly doped layer is an N-implanted region.

8. The method as claimed in claim 1, wherein said deeply doped layer is an N$^+$-implanted region.

9. The method as claimed in claim 1, wherein said organic polymer may not attach on said deeply implanted region, or can be removed by other solvent.

10. A method of using organic polymer as a covering layer for a device lightly doped drain structure, comprising the steps of:

depositing a polysilicon layer on a semiconductor substrate;

forming a patterned photo resist on the surface of said polysilicon layer;

performing shallow ion implantation to said semiconductor substrate to form a shallowly doped layer;

covering a covering layer of organic polymer on said photo resist to determine the size of line width;

performing deep ion implantation of high dose to said semiconductor substrate to form a deeply doped layer as a drain and a source;

performing an etch process to said polysilicon layer with said photo resist as a mask; and removing said covering layer and said photo resist to obtain a poly gate on said semiconductor substrate.

11. The method as claimed in claim 10, wherein said semiconductor substrate is a silicon wafer.

12. The method as claimed in claim 10, wherein boron ions, phosphorous ions, or other ions are implanted during said shallow ion implantation.

13. The method as claimed in claim 10, wherein boron ions, phosphorous ions, or other ions are implanted during said deep ion implantation.

14. The method as claimed in claim 10, wherein said covering layer of organic polymer and said photo resist are removed by means of oxygen plasma.

15. The method as claimed in claim 10, wherein said shallowly doped layer is an N-implanted region.

16. The method as claimed in claim 10, wherein said deeply doped layer is an N$^+$-implanted region.

17. The method as claimed in claim 10, wherein said organic polymer may not attach on said deeply implanted region, or can be removed by other solvent.

* * * * *